(12) United States Patent
Miyazaki

(10) Patent No.: US 6,750,691 B2
(45) Date of Patent: Jun. 15, 2004

(54) SEMICONDUCTOR INTEGRATED CIRCUIT DEVICE AND CHARACTERISTIC MEASUREMENT METHOD THEREOF

(75) Inventor: Hirokazu Miyazaki, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 95 days.

(21) Appl. No.: 10/287,023

(22) Filed: Nov. 4, 2002

(65) Prior Publication Data

US 2003/0168681 A1 Sep. 11, 2003

(30) Foreign Application Priority Data

Mar. 8, 2002 (JP) ........................................ 2002-062933

(51) Int. Cl.[7] .............................................. H01L 27/76
(52) U.S. Cl. ........................ 327/277; 327/284; 327/291; 257/334
(58) Field of Search .................................. 257/296–310

Primary Examiner—Fetsum Abraham
(74) Attorney, Agent, or Firm—Volentine Francos, PLLC

(57) ABSTRACT

A novel measurement method is provided capable of measuring characteristics of semiconductor integrated circuit devices without incurring the influence of external measuring means. A prescribed delay time applied to an address supplied from a microprocessor 11 to a memory 12 during normal operation is increased and a critical time where data corresponding to the address can no longer be read in by the microprocessor 11 from the memory 12 via the latch circuit 14 correctly is obtained. The delay time with which the address is supplied to the latch circuit 14 is increased with the address being supplied in a short-circuited manner to the latch circuit 14 rather than being supplied to the memory 12 and a short-circuit critical delay time where the address can no longer be read in correctly is obtained. A time difference corresponding to a difference in critical delay times is then obtained as the memory access time of the semiconductor integrated circuit device 10.

10 Claims, 10 Drawing Sheets

SEMICONDUCTOR INTEGRATED CIRCUIT DEVICE AND CHARACTERISTIC MEASUREMENT METHOD THEREOF

BACKGROUND OF THE INVENTION

The present invention relates to a semiconductor integrated circuit device suited to incorporation in a single semiconductor chip and a method for measuring circuit characteristics of the semiconductor integrated circuit device, and particularly relates to a semiconductor integrated circuit device and characteristic measuring method capable of performing high-precision measurements in a relatively straightforward manner.

One semiconductor integrated circuit of the related art is a semiconductor integrated circuit device referred to as a so-called system LSI. With this system LSI, a flash memory, for example, is incorporated as program memory together with a microprocessor (MPU) on a single semiconductor chip. These types of semiconductor integrated circuit devices are referred to as built-in flash Micro Controller Units (MCU) or one-chip microcontrollers.

With these one-chip microcontrollers, programs for microprocessors are stored in memory. A data latch circuit constituted by flip-flops constructed from, for example, a latch or a combination of latches is then provided between a data output port of the memory and a data input port of the microprocessor to ensure that appropriate program data requested by a microprocessor receiving a system clock is reliably read into the microprocessor.

When the above microprocessor requests data from the above memory, a data read control signal is supplied to the memory from the microprocessor. The address of the requested data is then outputted from the microprocessor, and the address outputted from the microprocessor is inputted to the memory after a prescribed address delay time (t AD), determined primarily by resistance of wiring provided between the microprocessor and the memory for the address and the capacitance of this wiring, has elapsed.

The memory then outputs data corresponding to this address to the data output port after a prescribed access time (t AA) from receiving the address at the address input port has elapsed.

The output data from the memory is inputted to the latch circuit after a prescribed data delay time (t DD) determined by the wiring resistance and wiring capacitance as described above.

When a latch control signal for latching data is received from the microprocessor, the latch circuit holds the inputted data and the data held at the latch circuit is read in to the microprocessor. However, a data latch delay time (t SD) that delays the clock timing by a prescribed amount of time is applied in order to take into consideration the wiring resistance and wiring capacitance due to the signal line for the latch control signal in order to ensure that the appropriate data corresponding to the address is reliably read into the microprocessor.

By setting this data latch delay time (t SD), as is well known in the related art, it is possible to reliably guarantee a set up time (t DS) constituting a minimum time for which the input data is valid for input to the latch circuit prior to input of the latch control signal and a hold time constituting a minimum time that the input data for input to the latch circuit is valid after input of the latch control circuit. As a result, appropriate data corresponding to the address can be reliably read into the microprocessor.

It is therefore necessary to have appropriate values for characteristic values such as, for example, set up time or memory access time in order to be aware of the performance of the system LSI.

Measurement means are connected to the address input port and the data output port of the memory of the semiconductor chip when measuring access time of the memory incorporated into the system LSI. The memory access time can then be measured using the measurement means.

However, in measurement methods where measurement means are inserted from outside of the system LSI, delay times between the measurement means and the input and output ports of the memory constituting the subject of measurement have a substantial influence on the measurement results. Further, generally speaking, the delay time between the measuring means and the subject of measurement is substantially larger than the delay time occurring during actual operation within the system LSI, meaning that measurements are therefore carried out under an environment differing from the actual operating conditions.

Therefore, in order to measure values accurately with the system LSI operating under normal conditions, it is necessary for the delay time between the measuring means and the subject being measured to accurately coincide with a delay time corresponding to that of the actual LSI, and for this reason accurate measuring of circuit characteristics has not been straightforward.

SUMMARY OF THE INVENTION

The present invention may provide a novel measurement method and a novel semiconductor integrated circuit device implementing this method capable of measuring in such a manner that, when measuring the characteristics of system LSI's, the influence of external measuring means that causes changes in normal operating conditions is no longer incurred.

The semiconductor integrated circuit characteristic measuring method of the present invention for measuring the characteristics of a semiconductor integrated circuit comprising a microprocessor operating in accordance with a clock, a memory having an address input port for receiving an address from the microprocessor and a data output port for outputting data corresponding to the address, and a latch circuit provided between the memory and the microprocessor and operating with a prescribed set up time according to a latch control signal from the microprocessor in order to provide data corresponding to the address from the memory to the microprocessor therefore comprises the steps of: increasing a prescribed delay time occurring during normal operation applied to the address supplied from the microprocessor to the memory, obtaining a critical delay time where the data corresponding to the address can no longer be read in by the microprocessor in an appropriate manner, and obtaining a set up time for the semiconductor circuit from this critical delay time.

DETAILED DESCRIPTION OF THE PREFERRED EMBODIMENTS

Figure 1:
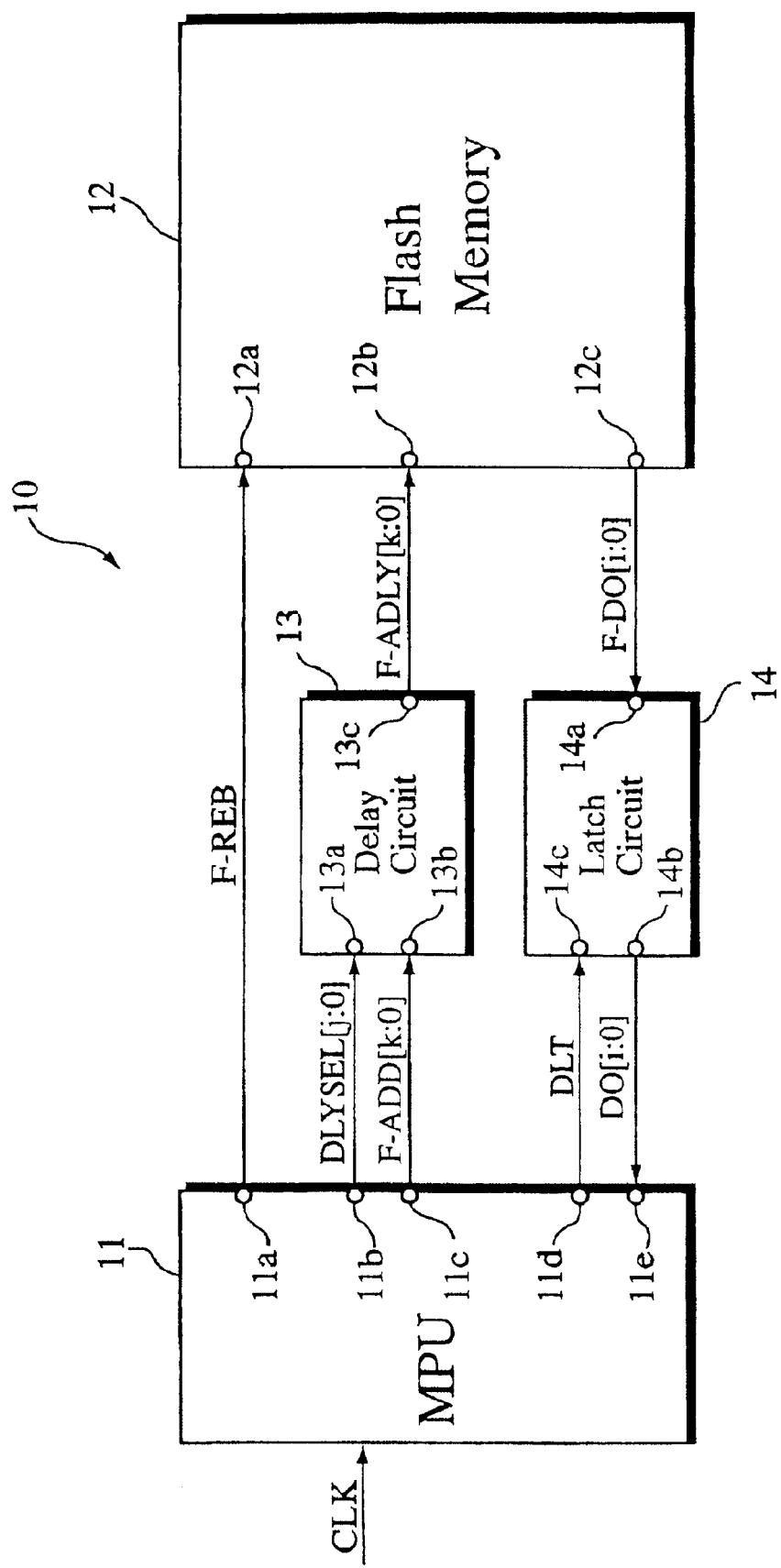
FIG. 1 is a block view outlining a specific example 1 of a semiconductor integrated circuit device of the present invention.

The following is a detailed description of embodiments of the present invention as shown in the drawings.

SPECIFIC EXAMPLE 1

FIG. 1 shows an outline of part of a semiconductor integrated circuit device 10 of the present invention.

The semiconductor integrated circuit device 10 of the specific example 1 of the present invention includes a microprocessor 11 referred to, for example, as an MPU, and a flash memory 12 storing programs of the microprocessor as data, with a delay circuit 13 and a latch circuit 14 being inserted between the microprocessor 11 and the flash memory 12.

The semiconductor integrated circuit device 10 shown in FIG. 1 is a so-called one-chip microcontroller, with the principal structural elements 11, 12, 13 and 14 all being incorporated on a single, for example, silicon semiconductor substrate (not shown).

The microprocessor 11 receives a system clock CLK and operates according to the clock CLK. When program data stored in the memory 12 is required, the microprocessor 11 outputs a data read-out control signal F-REB from a data read-out control signal port 11a to a read-out control signal input port 12a of the memory 12. The microprocessor 11 is also capable of outputting a delay control signal DLYSEL [j:0] from a delay control signal output port 11b and an address F-ADD[k:0] corresponding to the desired data from an address output port 11c. Here, [j:0] and [k:0] are appended as part of the code for the delay control signal of the address but these signals are actually sent using busses consisting of pluralities of data lines of 0 to j or 0 to k, with this therefore meaning the displaying of combinations of bit signals for each of the data lines constituting the busses.

Further, the microprocessor 11 outputs a latch control signal DLT well known in the related art from a latch control signal output port 11d to a latch circuit 14 as necessary, and program data DO[i:0] (described later) is received at a data input port 11e from the latch circuit 14.

The delay circuit 13 has a delay control signal input port 13a and an address input port 13b receiving a delay control signal DLYSEL[j:0] and an address F-ADD[k:0], respectively, from the microprocessor 11 and an address output port 13c.

When an address F-ADD[k:0] outputted by the address output port 11c of the microprocessor 11 is received at the address input port 13b, the delay circuit 13 outputs this address from the address output port 13c to address input port 12b of the memory 12 as a delayed address F-ADLY [k:0] with a delay corresponding to the delay control signal DLYSEL[j:0] inputted from the microprocessor 11.

In the following description, the delay circuit 13 is capable of outputting delayed addresses F-ADLY[k:0] with various prescribed delay times set by each delay element of the delay circuit from a situation where there is actually no delay at the delay circuit.

Figure 2:
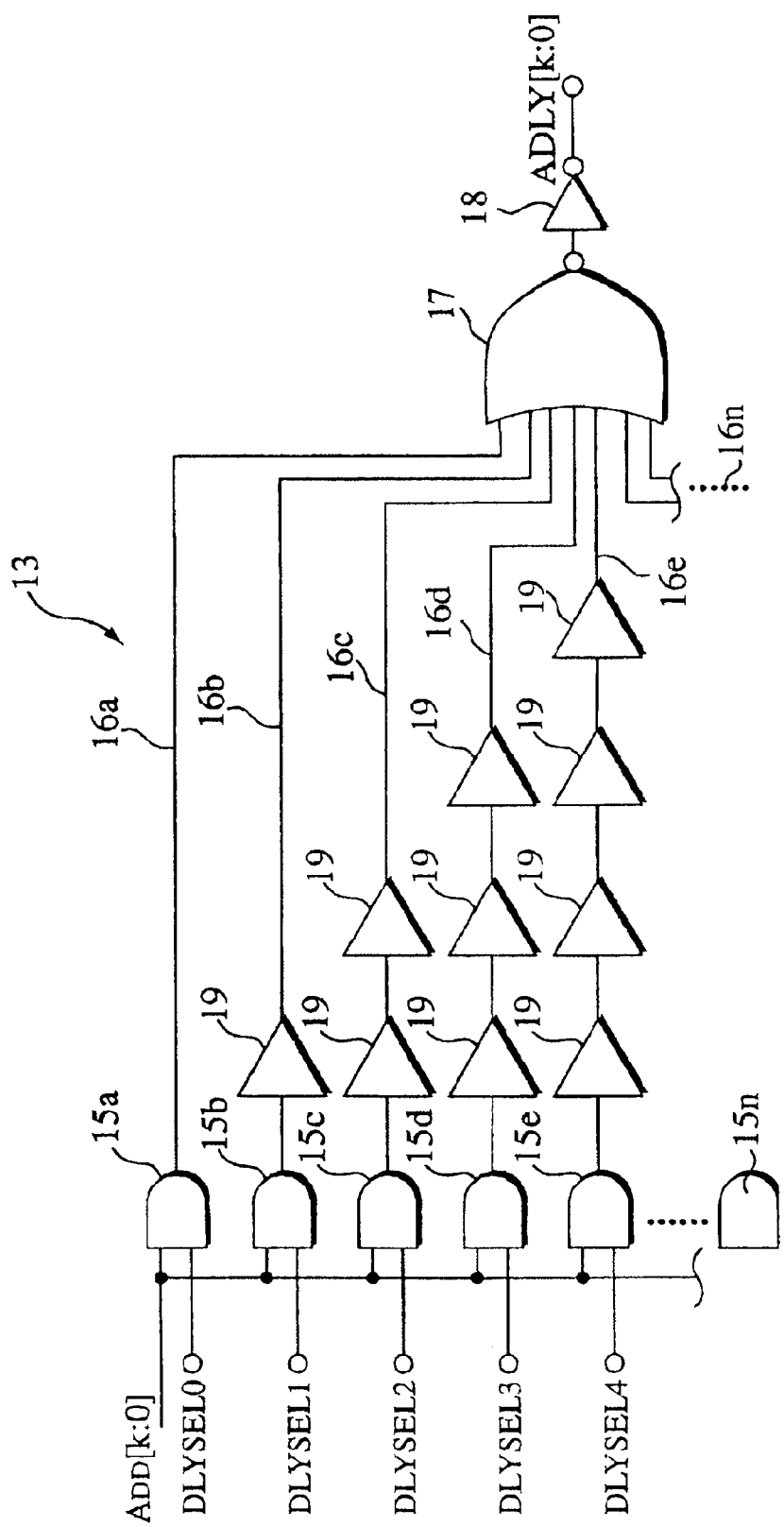
FIG. 2 is a circuit diagram showing a delay circuit of a semiconductor integrated circuit device of the present invention.

FIG. 2 shows an example of a specific circuit for the delay circuit 13 shown in FIG. 1.

The delay circuit 13 shown in FIG. 2 is comprised of a plurality of AND logic gates 15a to 15n, a NAND logic gate 17 to the input terminals of which output lines 16a to 16n of each of the AND logic gates 15a to 15n are connected, and an inverter 18 for inverting the signal from the NAND logic gate.

Each of the AND logic gates 15a to 15n has an input terminal for inputting an address F-ADD[k:0] from the data input port 11e of the microprocessor 11. In order to keep the drawings simple, the input terminals for the addresses F-ADD[k:0] in FIG. 2 are shown as single lines in line with bus notation. Each of the AND logic gates 15a to 15n have input terminals inputted with each of the bit signals for the delay control signal DLYSEL[j:0].

Namely, the address F-ADD[k:0] and the delay control signal DLYSEL[0] can be inputted to a first AND logic gate 15a, and the address F-ADD[k;0] inputted to the AND logic gate 15a is outputted at the output line 16a when control signal DLYSEL[0] of the delay control signal DLYSEL[j;0] is selectively inputted, i.e. when control signal DLYSEL[0] of the delay control signal DLYSEL[j:0] is selectively held at an H level.

Further, address F-ADD[k;0] and delay control signal DLYSEL[1] can be inputted to the second AND logic gate 15b and when the control signal DLYSEL[1] is selectively inputted, the address F-ADD[k:0] inputted to the AND logic gate 15b is outputted to the output line 16b.

Addresses F-ADD[k:0] can therefore be outputted to each of the output lines 16a to 16n, i.e. to the output busses 16a to 16n according to the delay control signal DLYSEL[j:0] by selecting the control signals for each of the signal lines for the delay control signal DLYSEL[j:0] inputted to each of the AND logic gates 15a to 15n.

With the exception of the first output line 16a connected to the first AND logic gate 15a, buffers 19 of the same specification for providing a delay of, for example, 1 ns, are inserted as delay elements for putting delays in the transmission of electrical signals at each of the output lines 16b to 16n.

A single buffer 19 is inserted at the second output line 16b connected to the second AND logic gate 15b, and at the third output line 16b to nth output line 16n thereafter a plurality of buffers 19 are inserted with the number of buffers in each line being increased in order for each output line.

With the delay circuit 13, when control signal DLYSEL [0] of the delay control signal DLYSEL[j:0] is selected, address F-ADD[k:0] is selectively outputted to the output line 16a. However, a delay element 19 is not inserted in the output line 16a. The address F-ADD[k:0] therefore passes through the inverter 18 without being subjected to a time delay by a delay element 19, i.e. is outputted from the delay circuit 13 without being influenced to any substantial extent by the delay circuit 13.

Conversely, when, for example, the delay control signal DLYSEL[1] of the delay control signal DLYSEL[j:0] is selected, the address F-ADD[k:0] is selectively outputted to the output line 16b. As a single delay element 19 is only inserted at the output line 16b, the address F-ADD[k:0] is outputted from the inverter 18 with a time delay of, for example, 1 ns defined by the delay element 19. When another delay control signal DLYSEL[j:1] other than the delay control signal DLYSEL[0] is selected from the delay control signal DLYSEL[j:0], the address ADD[k:0] is outputted from the delay circuit 13 with prescribed delay times being applied according to the number of delay elements 19 provided at each output line at the output lines 16b to 16n selected according to this select signal.

In the normal operating state of the microprocessor 11, the delay control signal DLYSEL[0] is selected from the delay control signal output port 11b of the microprocessor 11. There is therefore no delay applied by a delay element 19 at the delay circuit 13 and the address F-ADD[k:0] from the microprocessor 11 is therefore inputted to the address input port 12b of the memory 12 with the same prescribed address delay time (t AD) as in the related art.

On the other hand, in a measuring mode described later, the microprocessor 11 sequentially changes the select state of the delay control signal DLYSEL[j:0] from the delay control signal output port 11b in order from delay control signal DLYSEL[1] to delay control signal DLYSEL[j] every time the output of the address F-ADD[k:0] is changed. As a result, in measuring mode, from the normal operating state where delays are not given by the delay elements 19 at the delay circuit 13, a prescribed address delay time (t AD) is added every time the output of the address F-ADD[k:0] changes, and addresses are inputted to the address input port 12b of the memory 12 with delay times (t AD+t DLY) where delay times (t DLY) of the delay elements 19 are added by the delay circuit 13.

Figure 3:
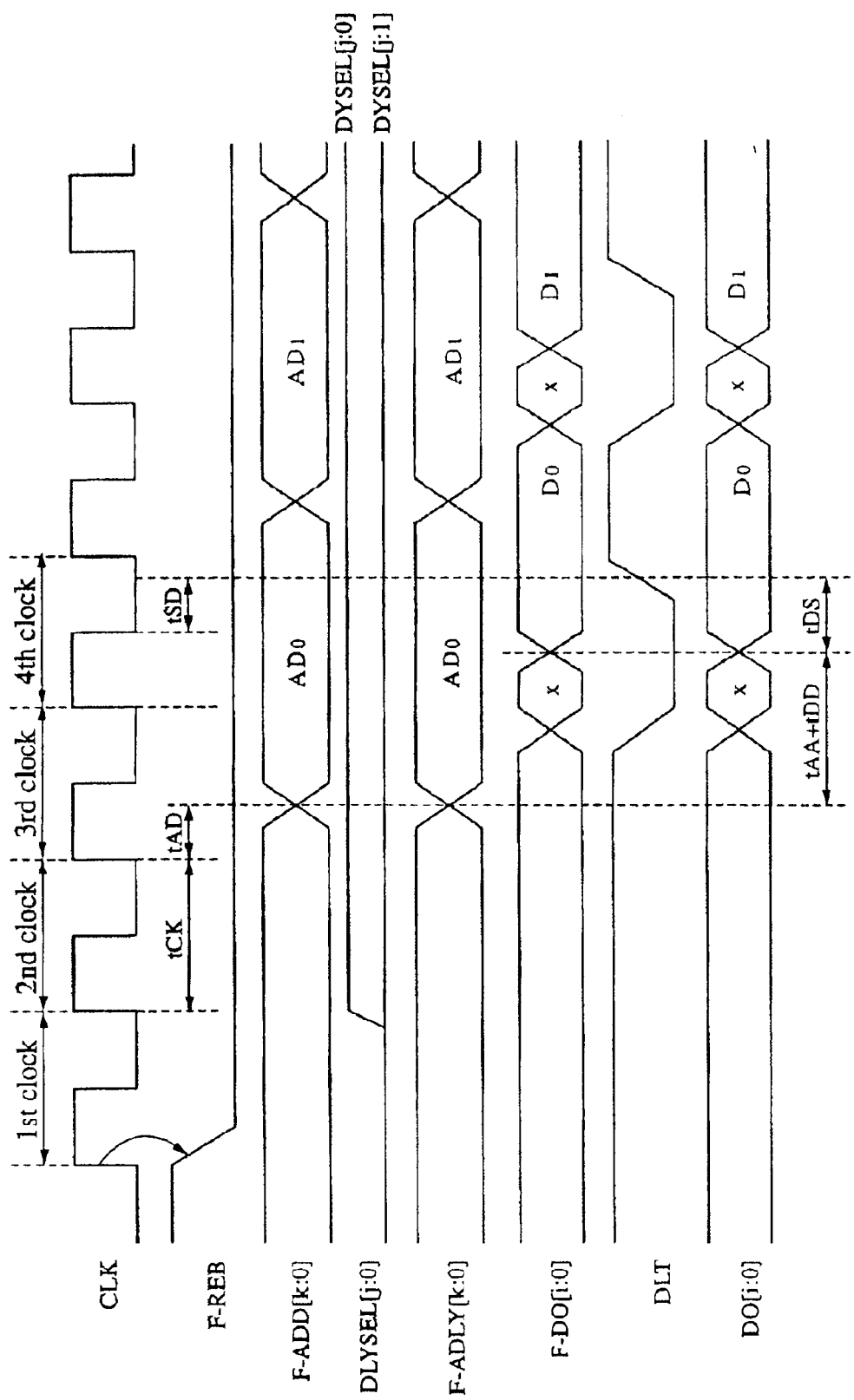
FIG. 3 is a timing chart showing an operating mode of specific example 1 of the present invention.

FIG. 3 shows a timing chart for when the semiconductor integrated circuit device 10 is in a normal operating state, i.e. in operating mode. FIG. 3 shows an example where a single operation is carried out in two clock periods (where one clock period is t CK) of the microprocessor 11.

During normal operation, as shown in FIG. 3, for example, the data read-out control signal F-REB from the microprocessor 11 goes from an H level to an L level in synchronization with the rising of a first clock CLK. As a result, the data read-out control signal F-REB is outputted to the read-out control signal input port 12a of the memory 12 from the microprocessor 11 and the memory 12 goes from a read-ready state to a read operation start state as a result of receiving this data read-out control signal F-REB.

When the read operation commences, i.e. in synchronization with a third clock CLK after a two clock period has elapsed from the first clock CLK being outputted from the microprocessor 11, the microprocessor 11 outputs the address F-ADD[k:0] for the required information stored in the memory 12 to the address output port 11c.

During normal operation, delay control signal DLYSEL [0] of the delay control signals DLYSEL[j:0] from the microprocessor 11 is selectively held at an H level, and other delay control signals DLYSEL[j:1] are held at L levels. Therefore, when address F-ADD[k:0] is outputted from the address output port 11c of the microprocessor 11, as described above, this address F-ADD[k:0] is inputted to the address input port 12b of the memory 12 as the delayed address F-ADLY[k:0] with the same address delay time (t AD) as in the related art where the delay circuit 13 has not practical influence.

When the memory 12 receives the delayed address F-ADLY[k:0] at the address input port 12b in a read operation receiving the data read-out control signal F-REB at the read-out control signal input port 12a, after a time referred to as the data access time (t AA) has elapsed from receiving the delayed address F-ADLY[k:0], data corresponding to the delayed address F-ADLY[k:0], i.e. data F-DO[i:0] corresponding to the address F-ADD[k:0], is outputted at the data output port 12c.

As known in the related art, the data access time (t AA) is the time taken from an address F-ADLY[k:0] inputted to the memory 12 making a transition to a prescribed address to output data F-DO[i:0] from the memory corresponding to the address to become stable.

Data F-DO[i:0] outputted at the data output port 12c is inputted to the data input port 14a of the latch circuit 14 and is delayed by a data delay time (t DD) determined mainly by the wiring resistance and wiring capacitance of the signal lines between the ports 12c and 14a and is inputted to the latch circuit 14.

As is well known in the related art, when the latch control signal DLT from the microprocessor 11 is held at an L level, i.e. when the latch control signal DLT is not being received at the latch control signal input port 14c, the data F-DO[i:0] inputted to the data input port 14a is transparently outputted at the data output port 14b as data DO[i:0] by the latch circuit 14. Upon receiving the latch control signal DLT, i.e. when the latch control signal DLT is at an H level, the latch circuit 14 operates in order to hold the input data inputted to the data input port 14a at this time, with this holding operation being updated every time the latch control signal DLT is inputted.

In the example shown in FIG. 3, the microprocessor 11 outputs the latch control signal DLT to the latch circuit 14 by changing the latch control signal DLT from an H level to an L level in synchronization with the falling of the third clock CLK. The microprocessor 11 then changes the latch control signal DLT from an L level to an H level on the falling of the fourth clock CLK.

Data DO[i:0] outputted at the data output port 14b of the latch circuit 14 is read in at the microprocessor 11 from the data input port 11e of the microprocessor 11. However, a data latch delay time (t SD) that delays the clock timing by a prescribed amount of time is applied in order to take into consideration the wiring resistance and wiring capacitance due to the signal line for the latch control signal DLT in order to ensure that the appropriate data corresponding to the address F-ADD[k:0] is reliably read into the microprocessor 11.

By setting the data latch delay time (t SD), as in the related art, the set up time (t DS) that is the minimum time for which the input data F-DO[i:0] to the latch circuit has to be valid prior to the input of the latch control signal DLT and the hold time that is the minimum time in which the input data F-DO[i:0] to the latch circuit 14 has to be valid after input of the latch control signal DLT can be appropriately guaranteed in the normal operating state of the semiconductor integrated circuit device 10.

The set-up time (t DS) is shown to be the time taken from the data F-DO[i:0] outputted from the memory 12 becoming settled to the latch control signal DLT returning to an H level.

In the normal operating mode, as described above, the delay elements 19 of the delay circuit 13 do not operate and therefore delays in time due to the delay elements 19 are not incurred. The address delay time (t AD), the access time (t AA), the data delay time (t DD) and the data latch delay time (t SD) can then be set appropriately so as to give an appropriate value for the set up time (t DS).

The relationship between the clock period (t CK) in normal operating mode, the address delay time (t AD), and access time (t AA), the data delay time (t DD), the data latch delay time (t SD) and the set up time (t DS) is shown by the following equation for the two clock operating mode shown in FIG. 3.

$$T\,DS = 1.5 \times t\,CK + t\,SD - (t\,AD + t\,AA + t\,DD) \quad (1)$$

Figure 4:
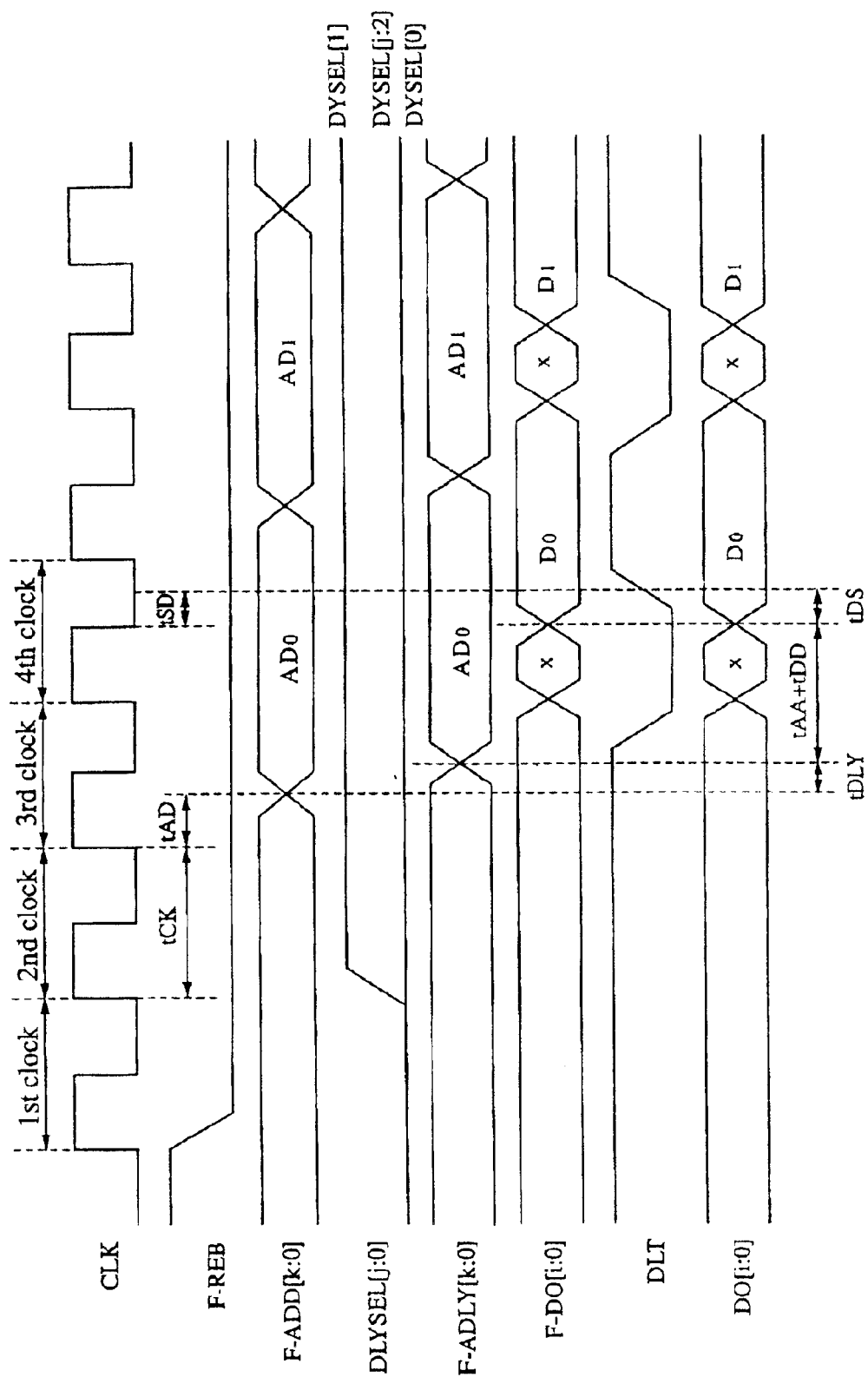
FIG. 4 is a further timing chart showing a measuring mode of specific example 1 of the present invention.

In the measuring mode for the semiconductor integrated circuit 10 for the specific example 1 of the present invention, as shown in the timing chart in FIG. 4, as with the example shown in FIG. 3, when the data read-out control signal F-REB changes from an H level to an L level, as described above, the address F-ADD[k:0] is outputted from the microprocessor 11 on the third clock CLK. Every time the address F-ADD[k;0] outputted from the address output port 11c is updated, the microprocessor 11 changes the delay control signal DLYSEL[j:0] from the delay control signal output port 11b from delay control signal DLYSEL[0] to delay control signals DLYSEL[j] stipulating a maximum delay time decided by the number of delay elements 19 provided at the output lines 16n.

In the measurement mode shown in FIG. 4, regarding the delay control signal DLYSEL[j:0] from the microprocessor 11, the delay control signal DLYSEL[1] is selectively held at an H level, other delay control signals DLYSEL[j:2] and [0] are held at L levels.

As a result, the address F-ADD[k:0] outputted from the microprocessor 11 passes through the output line 16b of the delay circuit 13 and is inputted to the address input port 12b of the memory 12 from the delay circuit 13.

The address F-ADD[k:0] outputted from the microprocessor 11 is then inputted to the address input port 12b of the memory 12 as the delayed address F-ADLY[k:0] with a delay time (t AD+t DLY) expressed as the sum of the prescribed address delay time (t AD) that is not influenced by the delay circuit 13 and the delay time (t DLY) stipulated by the delay elements 19 of the delay circuit 13.

Upon receiving the delayed address ADLY[k:0], as above, after an access time (t AA) has elapsed, the memory 12 outputs the data F-DO[i:0] corresponding to the address F-ADD[k:0] to the data output port 12c, this is delayed by the data delay time (t DD) as described above and input to the latch 14. The data F-DO[i:0] held at the latch circuit is then read into the microprocessor 11 as the data DO[i:0] in accordance with the latch control signal DLT.

At this time, as described above, in measuring mode, in addition to the prescribed address delay time (t AD), the address F-ADD[k:0] outputted by the microprocessor 11 is delayed by a delay time (t DLY) stipulated by the delay elements 19 of the delay circuit 13 before being inputted to the memory 12. The set up time (t DS) therefore becomes shorter when compared to the operating mode by the portion of the delay time (t DLY) added stipulated by the delay elements 19 of the delay circuit 13.

Delay elements exhibiting the desired time delays, within, for example, a range of 0.2 ns to 2 ns, that is within a range of a few percent of the clock period (t CK), can be used as the delay elements 19.

The relationship between the delay time (t DLY) specified by the delay element 19 of the delay circuit 13, the clock period (t CK), the address delay time (t AD), the access time (t AA), the data delay time (t DD), the data latch delay time (t SD) and the set up time (t DS) is shown by the following equation.

$$t\,DS = 1.5 \times t\,CK + t\,SD - (t\,AD + t\,DLY + t\,AA + t\,DD) \quad (2)$$

The delay time (t DLY) due to the delay circuit 13 increases every time the delay control signal DLYSEL[j:0] from the delay control signal output port 11b is updated, with the set up time (t DS) becoming smaller as this delay time (t DLY) increases.

When the set up time (t DS) is zero, the microprocessor 11 can no longer read in the correct data DO[i:0] corresponding to the outputted address F-ADD[k:0].

Expressing critical delay time at this time as TDLY, equation (2) may be expressed as:

$$0 = 1.5 \times t\,CK + t\,SD - (t\,AD + TDLY + t\,AA + t\,DD) \quad (3)$$

By taking equation (3) and moving TDLY to the left side, the following equation is obtained.

$$TDLY = 1.5 \times t\,CK + t\,SD - (t\,AD + t\,AA + t\,DD) \quad (4)$$

The right side of equation (4) is then the same as the right side of equation (1). The critical delay time (TDLY) can then be considered to be equal to the set up time (t DS).

Therefore, by obtaining the difference between the critical delay time when data DO[i:0] cannot be read in correctly, i.e. when there is an erroneous operation and the address delay time (t AD) during normal operation, in the example described above, a delay time decided by the number of delay elements 19 provided at the output lines 16a to 16n selected for the delay circuit 13 when data DO[i:0] is read in correctly can be taken to be the set up time (t DS).

According to the microprocessor 11 of specific example 1, delay time (t DLY) stipulated by a delay circuit 13 can be gradually increased without the use of external measuring means, and a set up time (t DS) can be obtained for the semiconductor integrated circuit device 10 from the critical delay time at which data DO[i:0] corresponding to an address F-ADD[k:0] outputted by the microcomputer 11 can no longer be read in correctly by the microprocessor 11.

It is therefore possible to measure set up time in a straightforward and accurate manner without being subject to the influence of external measuring means as was the case in the related art.

Various delay elements may be used in place of the buffer 19 as the delay elements 19, and each delay elements 19 by no means has to have the same delay characteristics so that it is also possible for each delay element to have different delay characteristics.

SPECIFIC EXAMPLE 2

Figure 5:
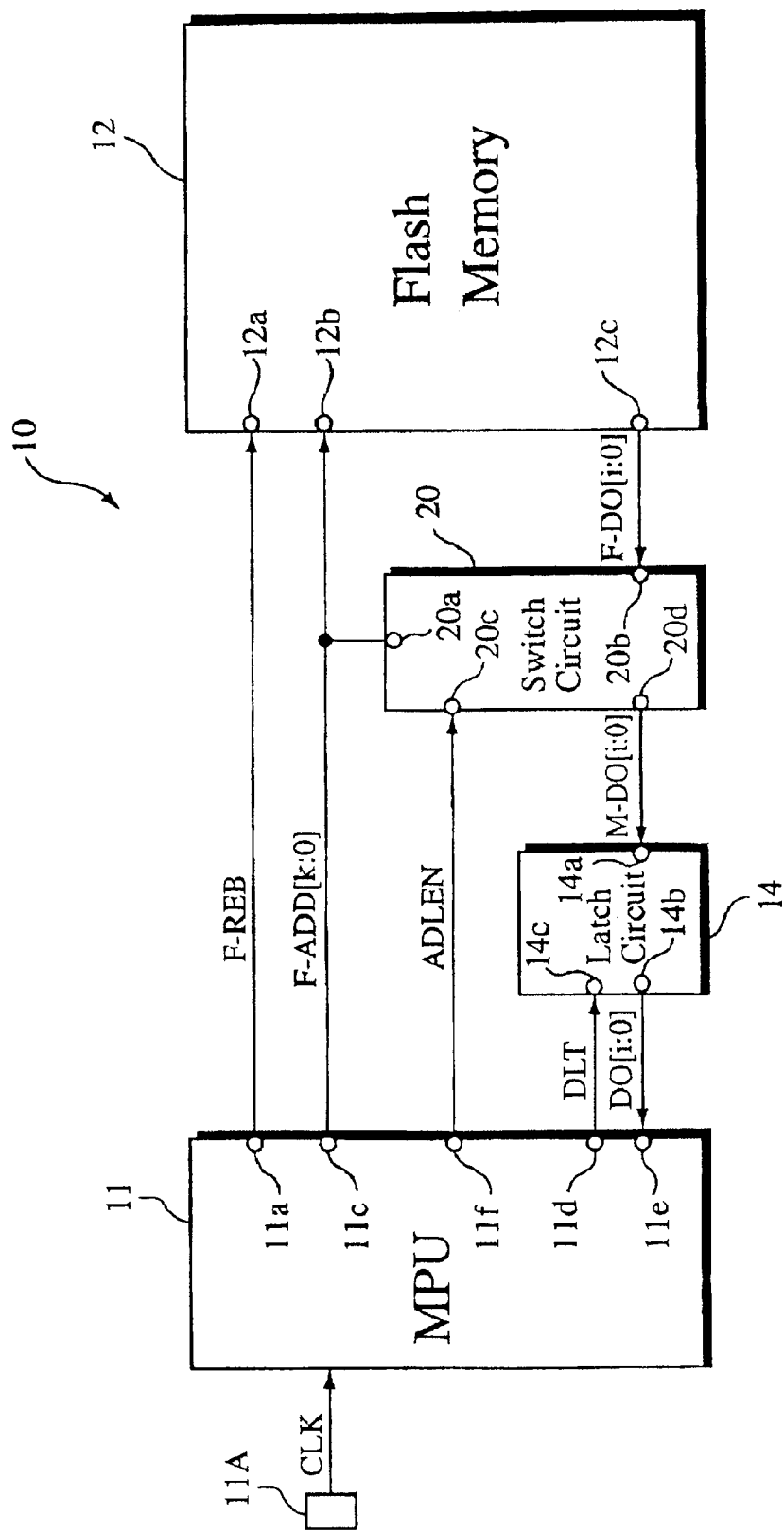
FIG. 5 is a block view outlining a specific example 2 of a semiconductor integrated circuit device of the present invention.

FIG. 5 is a similar drawing to FIG. 1 and shows a semiconductor integrated circuit device 10 for a specific example 2.

With the semiconductor integrated circuit device 10 of this specific example, a switch circuit 20 is provided connected to the latch circuit 14 between the microprocessor 11 and the memory 12 in place of the delay circuit 13. Further, in specific example 2, a clock period (t CK) of a clock source 11A supplying a clock CLK to the microprocessor 11 is variable.

As shown in FIG. 5, at the integrated circuit device 10, a data read out control signal F-REB from the data read-out control signal port 11f the microprocessor 11 is inputted to readout control signal input port 12a of the memory 12 and an address F-ADD[k:0] from the address output port 11c is inputted to the address input port 12b of the memory 12 with a prescribed address delay time (t AD).

Upon receiving the address F-ADD[k:0] at the address input port 12b, the memory 12 outputs data F-DO[i:0] corresponding to the address F-ADD[k:0] at the data output port 12c after the access time (t AA) has elapsed.

The data F-DO[i:0] outputted from the memory 12 passes through the switch circuit 20 to become data M-DO[i:0] and can then be inputted to the data input port 14a of the latch circuit 14 after being delayed by the prescribed data delay time (t DD). As described above, the input data M-DO[i:0] can be read in at the data input port 11e in accordance with the latch control signal DLT from the latch control signal output port 11a of the microprocessor 11.

The switch circuit 20 is equipped with a first input port 20a for receiving an address F-ADD[k:0] going from the microprocessor 11 to the memory 12, a second input port 20b receiving data F-DO[i:0] from the memory 12, a short-circuit signal input port 20c receiving a short-circuit signal ADLEN from a short-circuit signal output port 11f of the microprocessor 11, and an output port 20d selectively connected to the first input port 20a and the second input port 20b in accordance with the short-circuit signal ADLEN supplied to the short-circuit signal input port 20c.

The output port 20d is connected to the data input port 14a of the latch circuit 14. The switch circuit 20 then selectively connects the output port 20d to the second input port 20b with the limitation that the short-circuit signal ADLEN is not received from the microprocessor 11, i.e. that the short-circuit signal ADLEN is held at an L level.

Under normal operating conditions, the clock period (t CK) of the clock going to the microprocessor 11 is held at a normal appropriate value as with specific example 1. The operation timing of the microprocessor 11 is shown in FIG. 6.

Figure 6:
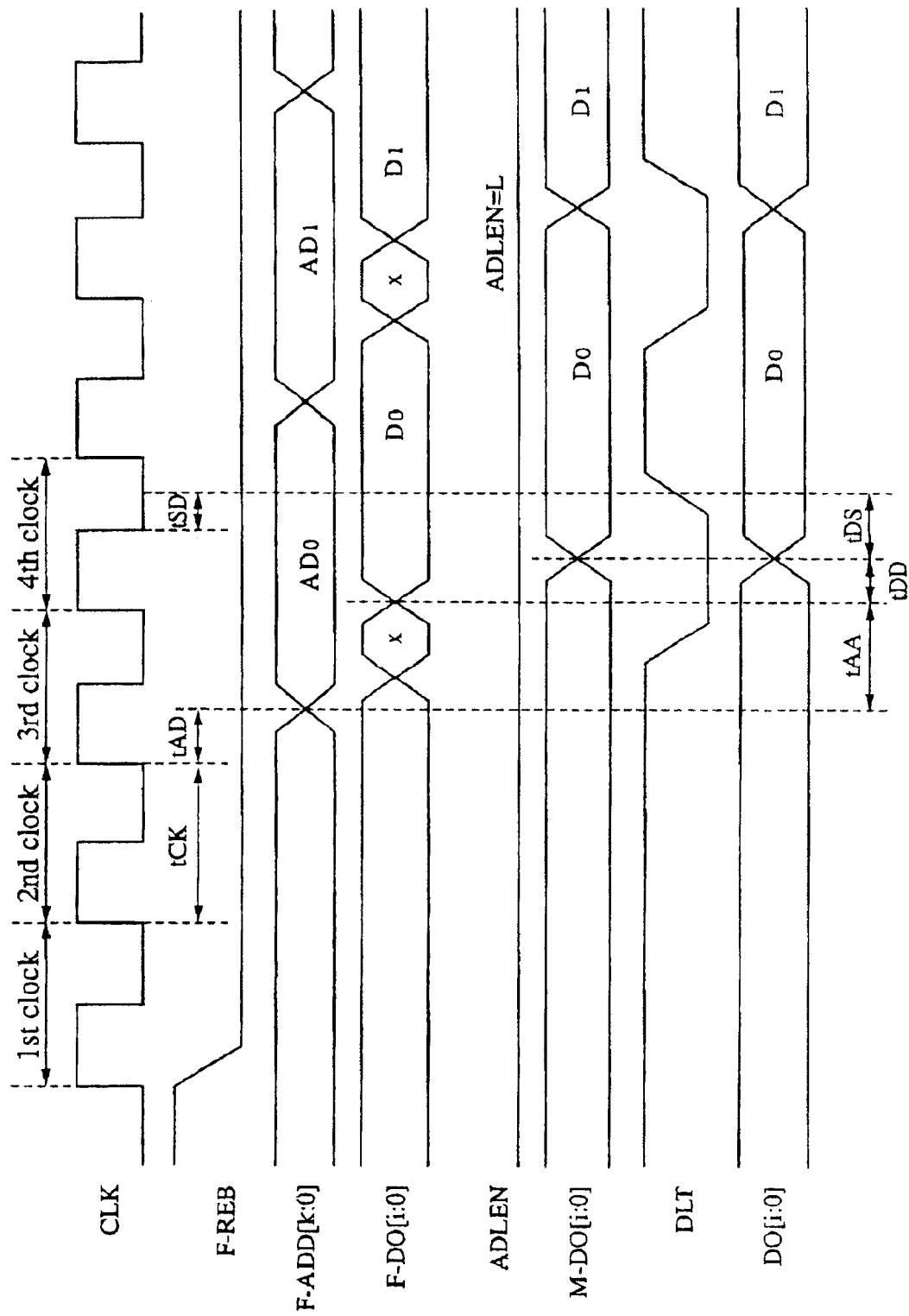
FIG. 6 is a timing chart showing a non-short-circuiting operating mode of specific example 2 of the present invention.

In the operating conditions shown in FIG. 6, the short-circuit signal ADLEN from the microprocessor 11 is held at an L level. The switch circuit 20 therefore outputs the data F-DO[i:0] outputted from the memory 12 so as to correspond to the address F-ADD[k:0] to the output port 20d rather than output the address F-ADD[k:0] at the output port 20d in a short-circuited manner from the microprocessor 11.

As a result, data DO[i:0] corresponding to the address F-ADD[k:0] from the microprocessor 11 is read into the microprocessor 11 at the timing shown in FIG. 6. The relationship between the clock period (t CK), the address delay time (t AD), the access time (t AA), the data delay time (t DD), the data latch delay time (t SD) and the set up time (t DS) is shown by the following relational expression as with the equation (1) for the operating mode shown by the two clock operating mode shown in FIG. 3.

In measuring mode, first, the clock period (t CK) from the clock source 11A in normal operating mode where the switch circuit 20 is not short-circuited is gradually increased. A critical frequency where the microprocessor 11 can no longer read in data DO[i:0] corresponding to address F-ADD[k:0] correctly can then be obtained by increasing the clock period (t CK). This critical frequency refers to when the set up time (t DS) becomes zero.

Figure 7:
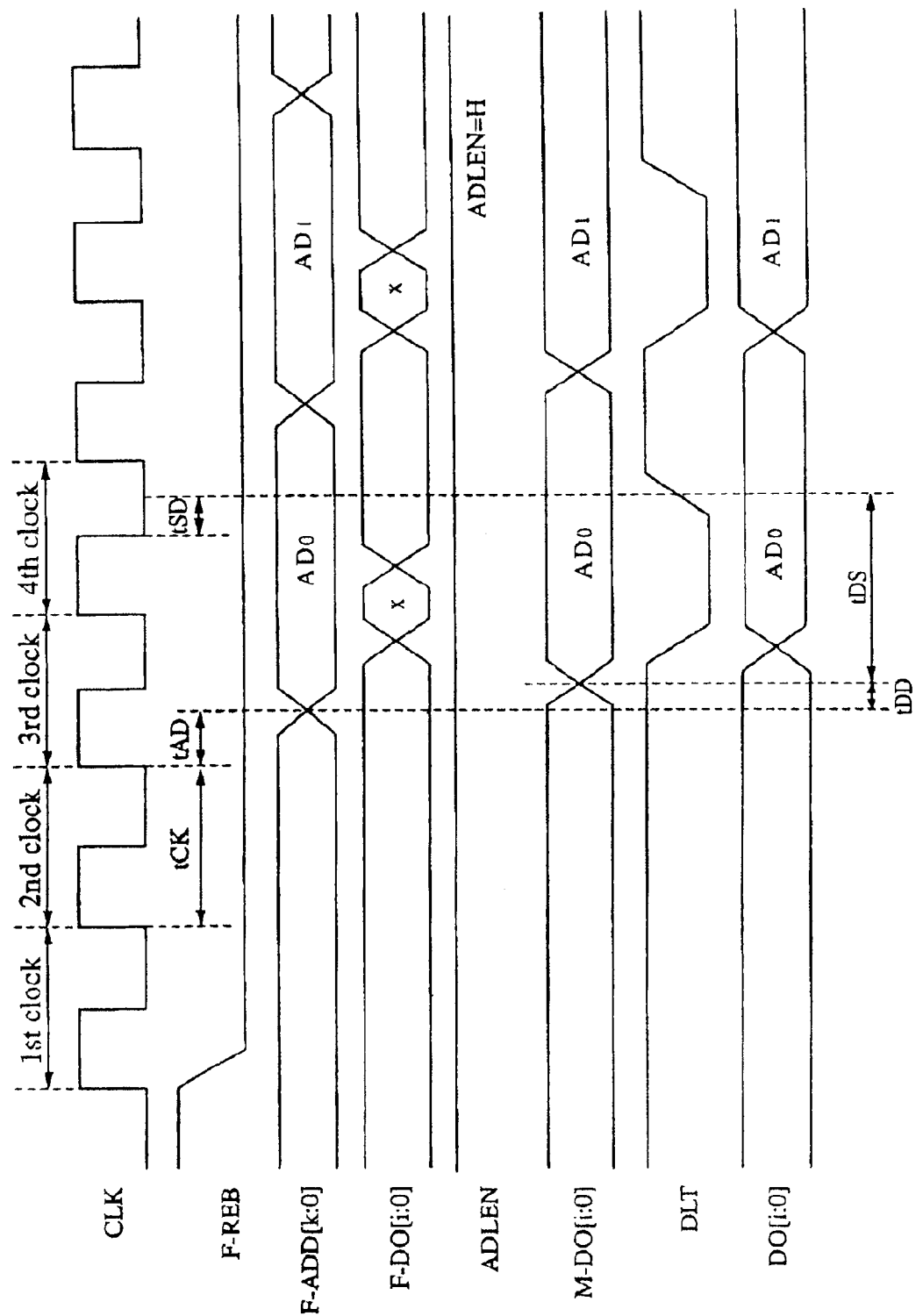
FIG. 7 is a timing chart showing a short-circuiting operating mode of specific example 2 of the present invention.

After this, as shown in FIG. 7, the short-circuit signal ADLEN from the microprocessor 11 is held at an H level with the clock (t CK) held in this state under normal operating conditions. The switch circuit 20 is then put in a short-circuited state by the changing of the short-circuit signal ADLEN. When the switch circuit 20 is short-circuited, as described above, the first input port 20a is connected to the output port 20d. The address F-ADD[k:0] from the microprocessor 11 then passes through the output port 20d of the switch circuit 20 without passing through the memory 12 before being outputted at the data input port 14a of the latch circuit 14 in a short-circuited manner.

A timing chart for this time is shown in FIG. 7. In the short-circuit operating mode, the microprocessor 11 reads in the address F-ADD[k:0] itself as the data DO[i:0] via the switch circuit 20 and the latch circuit 14 rather than the data DO[i:0] corresponding to the address F-ADD[k:0].

Then, in this short-circuited state, the clock period (t CK) is gradually increased from the clock period CLK for during normal operating mode as with the case described above. A short-circuit critical frequency where the microprocessor 11 can no longer read in data DO[i:0], i.e. the address F-ADD [k:0] corresponding to address F-ADD[k:0] correctly can then be obtained by increasing the clock period (t CK).

This critical frequency refers to when the set up time (t DS) becomes zero, as described above.

As is shown by comparing FIG. 6 showing the non-short-circuited operating mode and FIG. 7 showing the short-circuited operating mode, the sum of the access time (t AA), the data delay time (t DD) and the set up time (t DS) relating to the memory 12 occurring in non-short-circuited mode corresponds to the sum of the data delay time (t DD) and set up time (t DS) occurring in short-circuit operating mode. This difference corresponds to the access time (t AA).

As described above, these critical frequencies can be seen to give a set up time (t DS) of zero.

A period difference corresponding to the difference between a first critical frequency obtained in the non-short-circuit operation mode and a second critical frequency obtained in the short-circuit operating mode is then obtained as the access time (t AA).

According to specific example 2 described above, the access time (t AA) of the memory 12 that could not be obtained in specific example 1 can be obtained by using the switching operation of the switch circuit 20 and the clock period (t CK) of the clock source 11A rather than using external measuring means.

It is therefore possible to measure access time (t AA) in a straightforward and accurate manner without being subject to the influence of external measuring means as was the case in the related art.

By configuring the switch circuit 20 in the manner shown in FIG. 9 and described in the following, as with specific example 3 shown in the following, by having the switch circuit 20 built into the memory 12 it becomes possible to obtain the access time (t AA) and then use this access time (t AA) to obtain a more accurate data delay time (t DD).

SPECIFIC EXAMPLE 3

Figure 8:
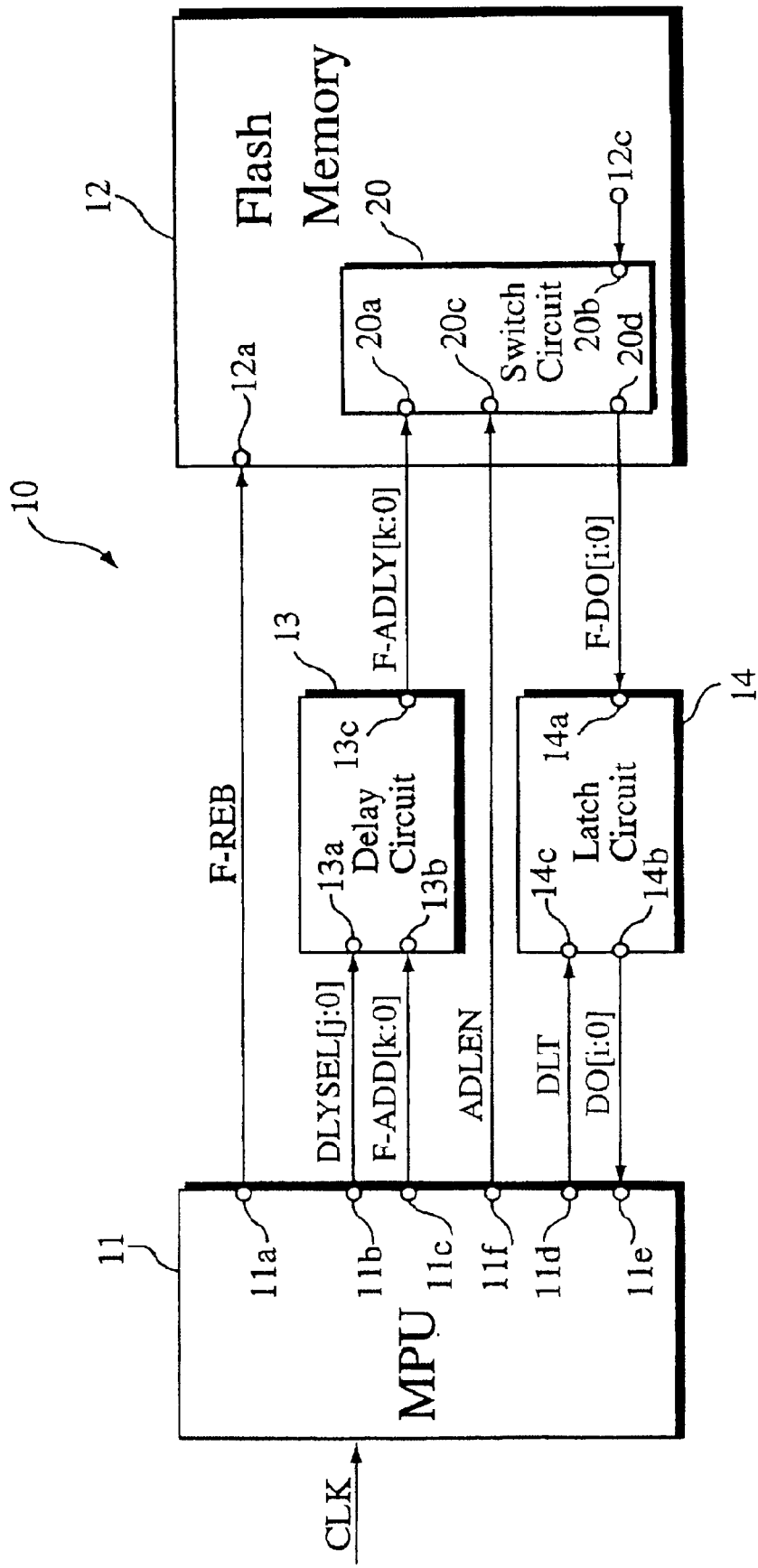
FIG. 8 is a block view outlining a specific example 3 of a semiconductor integrated circuit device of the present invention.

The semiconductor integrated circuit device 10 of specific example 3 shown in FIG. 8 comprises the delay circuit 13 that is the same as that shown for specific example 1 for applying a prescribed time delay to the address F-ADD[k:0] from the microprocessor 11, and the switch circuit 20 for selectively providing the delayed address F-ADLY[k:0] from the delay circuit 13 to the memory 12 and the latch circuit 14. In the example in FIG. 8, the switch circuit 20 is built-into the memory 12.

As shown in FIG. 8, at the integrated circuit device 10 of specific example 3, a data read out control signal F-REB from the data read-out control signal port 11a of the microprocessor 11 is inputted to read-out control signal input port 12a of the memory 12 and an address F-ADD[k:0] from the address output port 11c is inputted to address input port 13b of the delay circuit 13 as described above.

The delay control signal DLYSEL[j:0] is inputted to the delay control signal input port 13a of the delay circuit 13 from the delay control signal output port 11b of the microprocessor 11.

The delay circuit 13 then outputs the address F-ADD[k:0] at the first input port 20a of the switch circuit 20 via the address output port 13c as the delayed address F-ADLY[k:0] with a delay time corresponding to the delay control signal DLYSEL[j:0].

The second input port 20b of the switch circuit 20 is connected to a center amplifier (not shown) of the memory 12 which is well known in the related art and constitutes the output of the memory 12, with the output of the memory 12 being inputted to the second input port 20b in the same manner as in specific example 2.

As in specific example 2, the switch circuit 20 selectively connects the first input port 20a and the second input port 20b to the short-circuit signal input port 20c in accordance with the short-circuit signal ADLEN from the short-circuit signal output port 11f of the microprocessor 11. When the short-circuit signal ADLEN is not being received at the short-circuit signal input port 20c, i.e. when the short-circuit signal ADLEN is an L level, the switch circuit 20 connects the second input port 20b to the output port 20d. When the short-circuit signal ADLEN is then received at the short-circuit signal input port 20c, i.e. when the short-circuit signal ADLEN becomes an H level, the first input port 20a is connected to the output port 20d.

Figure 9:
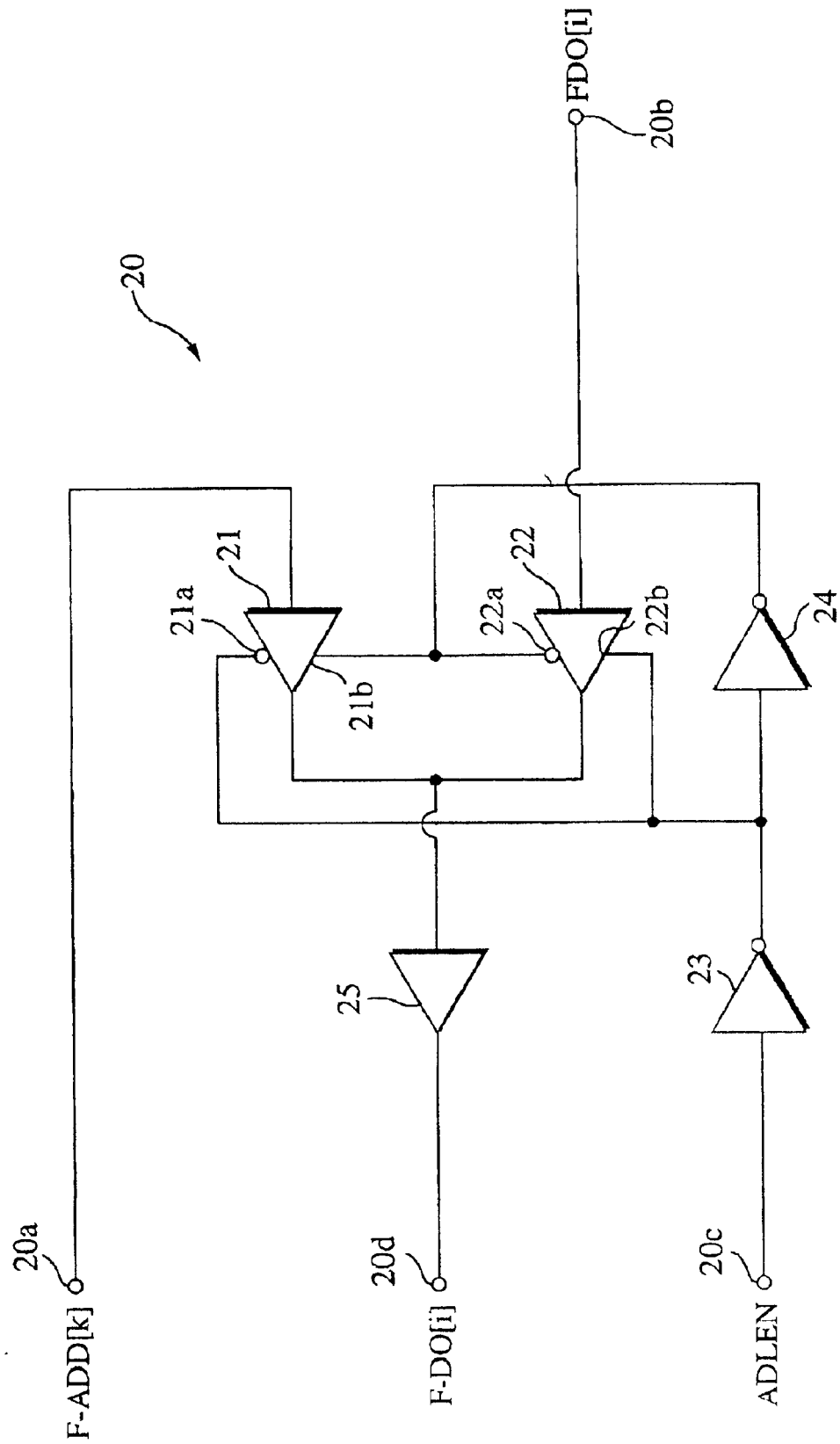
FIG. 9 is a circuit diagram showing a switch circuit of a semiconductor integrated circuit device of the present invention.

A specific example of a circuit for the switch circuit 20 is shown in FIG. 9.

As shown in FIG. 9, the switch circuit 20 is such that each switch circuit 20 is provided with a first tri-state buffer 21 for receiving the address F-ADD[k] inputted to the first input port 20a and a second tri-state buffer 22 for receiving data F-DO[i] inputted at the second input port 20b, for each bit of the address F-ADD[k:0].

Each of the tri-state buffers 21 and 22 receive L level signals at inverting control input terminals 21a and 22a and when H level signals are received at the non-inverting control input terminals 21b and 21b respectively, the inputted signal is outputted. Further, when H level signals are received at inverting control input terminals 21a and 22a and L level signals are received at the non-inverting control input terminals 21b and 21b respectively, a high impedance state will exist across the input and output.

The short-circuit signal ADLEN inputted to the short-circuit signal input port 20c passes through the inverter 23 and is inputted to the inverting control input terminal 21a of the first tri-state buffer 21 and the non-inverting control input terminal 22b of the second tri-state buffer 22. The short-circuit signal ADLEN passes through the inverter 23, passes through a second inverter 24 connected in series with the inverter 23, and is inputted to the non-inverting control input terminal 21b of the first tri-state buffer 21 and the inverting control input terminal 22a of the second tri-state buffer 22.

The output terminals of both the tri-state buffers 21 and 22 are connected to output port 20d via the output buffer 25.

When the short-circuit signal ADLEN is held at an L level, an H level signal is inputted to the inverting control input terminal 21a of the first tri-state buffer 21 and the non-inverting control input terminal 22b of the second tri-state buffer 22, and an L level signal is inputted to the non-inverting control input terminal 21b of the first tri-state buffer 21 and the inverting control input terminal 22a of the second tri-state buffer 22. The input signal (data F-DO[i:0]) of the second tri-state data buffer 22 of the signal inputted to the first tri-state buffer 21 and the second tri-state buffer 22 is outputted to the output port 20d via the output buffer 25.

On the other hand, when the short-circuit signal ADLEN changes to an H level, an L level signal is inputted to the inverting control input terminal 21a of the first tri-state buffer 21 and the non-inverting control input terminal 22b of the second tri-state buffer 22, and an H level signal is inputted to the non-inverting control input terminal 21b of the first tri-state buffer 21 and the inverting control input terminal 22a of the second tri-state buffer 22. The input signal (address F-ADD[k:0]) of the first tri-state data buffer 22 of the signal inputted to the first tri-state buffer 21 and the second tri-state buffer 22 is outputted to the output port 20d via the output buffer 25.

The delay circuit 13 of specific example 2 can be used as the delay circuit in the same way as shown in FIG. 2.

According to this delay circuit 13, as described above, when the delay control signal DLYSEL[0] of the delay control signal DLYSEL[j:0] from the delay control signal output port 11b of the microprocessor 11 is kept at an H level and other delay control signals DLYSEL[j:1] are kept at an L level, address F-ADD[k:0] is outputted at the first input port 20a of the switch circuit 20 as the delayed address ADLY[k:0] with a prescribed address delay time (t AD) and without being subject to the influence of the delay elements 19 of the delay circuit 13.

Upon receiving the delay address F-ADLY[k:0] at the first input port 20a, after the prescribed data access time (t AA) has elapsed, the memory 12 outputs the data F-DO[i:0] corresponding to this address to the second input port 20b.

The short-circuit signal output port 11f of the microprocessor 11 is held at an L level during normal operation.

The switch circuit 20 selectively connects the output port 20d with the second input port 20b and the data DO[i:0] is therefore inputted to the data input port 14a of the latch circuit 14.

The latch circuit 14 outputs the data DO[i:0] to the microprocessor 11 in accordance with the latch control signal DLT from the latch control signal output port lid of the microprocessor 11. An appropriate data latch delay time (t SD) is provided at the latch control signal DLT in order to ensure that the prescribed set up time (t DS) is appropriate. The appropriate data DO[i:0] corresponding to the address F-ADD[k:0] can then be read in at the microprocessor 11.

The timing chart for during normal operation is the same as that shown in FIG. 3 for specific example 1.

In measuring mode, first, the delay control signal DLYSEL[j:0] is changed from delay control signal DLYSEL [1] through to delay control signal DLYSEL[j] as described for specific example 1 in order to increase the delay time (t DLY) due to the delay elements 19 sequentially using the delay circuit 13 with the switch circuit 20 in a non-short-circuiting state.

The delay time (t DLY) due to the delay circuit 13 increases in accordance with changes in the delay control signal DLYSEL[j:0]. The set up time (t DS) therefore falls as described in FIG. 4 with regards to specific example 1 in accompaniment with the increase in delay time (t DLY). When the set up time (t DS) is zero, the microprocessor 11 can no longer read in the data DO[i:0] correctly. A critical delay time T1 where the set up time (t DS) is zero can then be obtained by gradually increasing the delay time (t DLY).

$$T1 = t\,AD + t\,AA - tDD - tDS - 1.5 \times t\,CK \qquad (5)$$

As described in the above, t AD indicates the address delay time, t AA indicates the memory access time, t DD indicates the data delay time, t DS indicates a set up time, and t CK indicates a clock period.

Figure 10:
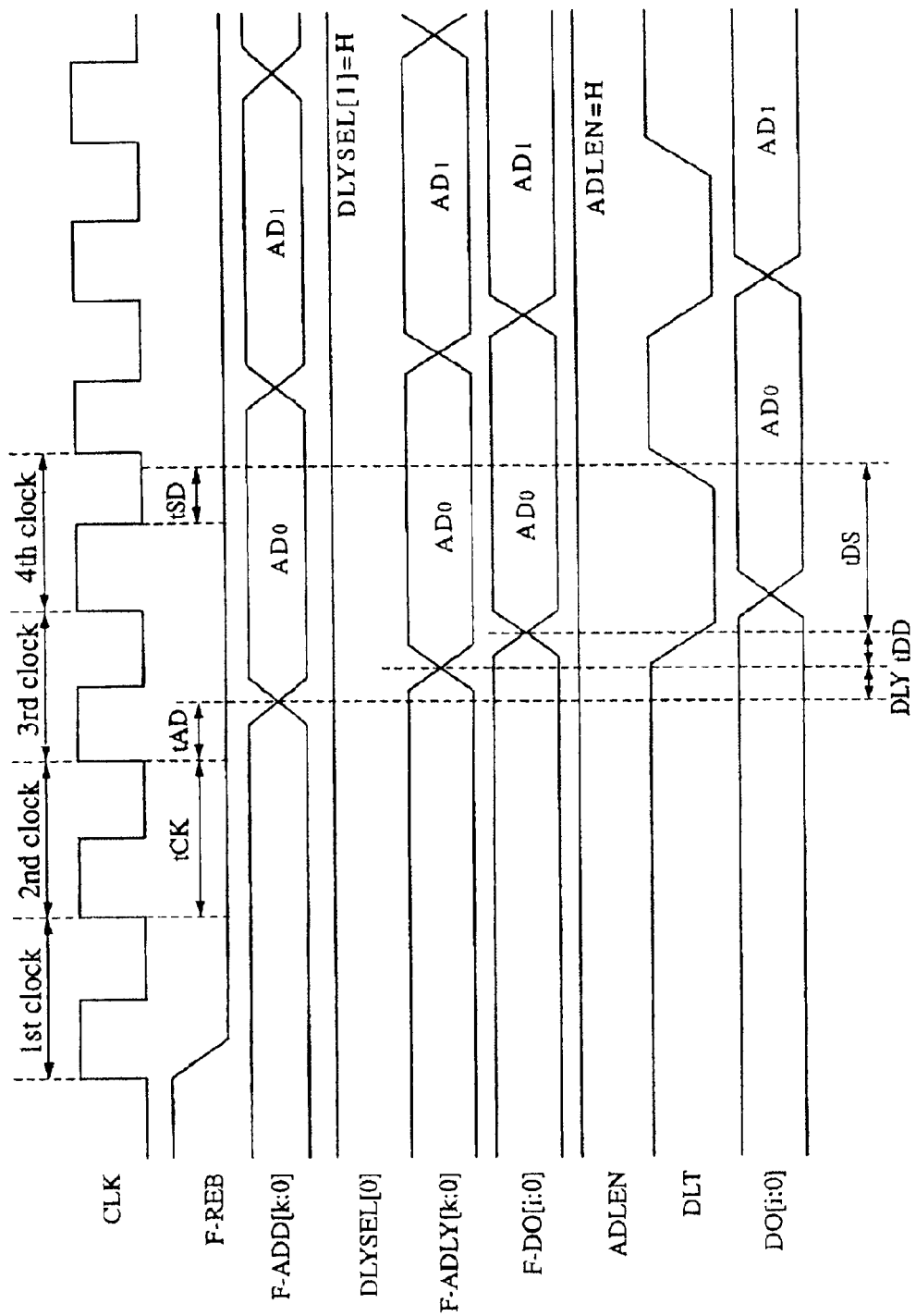
FIG. 10 is a timing chart showing a short-circuiting operating mode of specific example 3 of the present invention.

After deducing the critical delay time T1 in the aforementioned non-short-circuit state, as shown in FIG. 10, the short-circuit signal ADLEN from the short-circuit signal output port 11f of the microprocessor 11 is held at an H level.

The switch circuit 20 is then put in a short-circuited state by the changing of the short-circuit signal ADLEN.

When the switch circuit 20 is short-circuited, as described above, the first input port 20a is connected to the output port 20d. The address F-ADD[k:0] from the microprocessor 11 then passes through the output port 20d of the switch circuit 20 without passing through the memory 12 before being outputted at the data input port 14a of the latch circuit 14 in a short-circuited manner.

In measuring mode, first, the delay control signal DLYSEL[j:0] is changed from delay control signal DLYSEL[1] through to delay control signal DLYSEL[j] as described for specific example 1 in order to increase the delay time (t DLY) due to the delay elements 19 sequentially using the delay circuit 13 with the switch circuit 20 in a non-short-circuiting state.

The timing chart of FIG. 10 shows short-circuit operating mode when the delay time (t DLY) is set in the short-circuit state. As shown in FIG. 10, when the delay time (t DLY) due to the delay circuit 13 increases in accordance with changes in the delay control signal DLYSEL[j:0], the set up time (t DS) becomes shorter as in the case described in FIG. 4 with regards to specific example 1. When the set up time (t DS) is zero, the microprocessor 11 can no longer read in the data at address F-ADD[k:0] correctly. A short-circuit critical delay time T0 where the set up time (t DS) in this short-circuited state is zero can then be obtained by gradually increasing the delay time (t DLY).

The critical delay time T0 in this short-circuited state is given by the following equation.

$$T0 = t\,AD + t\,DD + t\,DS - 1.5 \times t\,CK \qquad (6)$$

As described in the above, t AD indicates the address delay time, t DD indicates the data delay time, t DS indicates a set up time, and t CK indicates a clock period.

As becomes clear from comparing equations (5) and (6), the access time (t AA) of the memory 12 can be obtained by subtracting the short circuit critical delay time T0 from the critical delay time T1 when there is no short-circuit.

According to the integrated circuit device 10 shown in specific example 3, as described above, the access time (t AA) of the memory 12 can be obtained from the first critical delay time T1 obtained in the non-short-circuit state and the short-circuit delay time T0 constituting the second critical delay time obtained in the short-circuit state without employing external measuring means and without using a frequency-variable clock source CLK.

Therefore, according to specific example 3 described above, the access time (t AA) of the memory 12 that could not be obtained in specific example 1 can be obtained without having to use a frequency-variable clock source by using the switching operation of the switch circuit 20 and by gradually increasing the delay time due to the delay circuit 13.

In the above, a description of the present invention is given for an example where the microprocessor has a two clock operation but the present invention is by no means limited in this respect and a microprocessor of the desired number of clock operations such as a one or three clock-operating microprocessor may also be used as the microprocessor.

Further, a description is given with flash memory as the example of the memory but the present invention is by no means limited in this respect and may also be applied to various other types of memory such as SRAM, EEPROM or ROM etc.

Further, the switching circuits and delay circuits are by no means limited to those shown in the drawings and various switching circuits and delay circuits may also be employed.

According to the characteristic measurement method for a semiconductor integrated circuit device of the present invention, as described above, characteristic measurements can be performed in a straightforward and accurate manner without being influenced by external measuring means and without bringing about errors that are invited by the use of such external measuring means.

Further, according to the semiconductor integrated circuit device of the present invention, the measuring method of the present invention can be implemented in a straightforward manner, and as a result, accurate values can be known for circuit characteristics such as set up time and memory access time in a straightforward manner.

What is claimed is:

1. A semiconductor integrated circuit characteristic measuring method for measuring the characteristics of a semiconductor integrated circuit comprising a microprocessor operating in accordance with a clock, a memory having an address input port for receiving an address from the microprocessor and a data output port for outputting data corresponding to the address, and a latch circuit provided between the memory and the microprocessor and operating with a prescribed set up time according to a latch control signal from the microprocessor in order to provide data corresponding to the address from the memory to the microprocessor, said method comprising the steps of:

increasing a prescribed delay time occurring during normal operation applied to an address supplied from the microprocessor to the memory;

obtaining a critical delay time where data corresponding to the address can no longer be read in by the microprocessor in an appropriate manner; and obtaining a set up time for the semiconductor circuit from this critical delay time.

2. The characteristic measuring method of claim 1, wherein a time difference between the critical delay time and the delay time occurring during normal operation is obtained as the set up time for the semiconductor integrated circuit.

3. A semiconductor integrated circuit characteristic measuring method for measuring the characteristics of a semiconductor integrated circuit comprising semiconductor integrated circuit comprising a microprocessor operating in accordance with a clock, a memory having an address input port for receiving an address from the microprocessor and a data output port for outputting data corresponding to the address and a latch circuit provided between the memory and the microprocessor and operating with a prescribed set up time according to a latch control signal from the microprocessor in order to provide data corresponding to the address from the memory to the microprocessor, said method comprising the steps of:

increasing the frequency of the clock supplied to the microprocessor;

obtaining a critical frequency where data corresponding to the address can no longer be read in by the microprocessor in an appropriate manner;

increasing the clock frequency by supplying the address to the latch circuit in a short-circuited manner without supplying the address to the memory;

obtaining a short-circuiting critical frequency where the address can no longer be read in correctly by the microprocessor; and obtaining a period difference corresponding to a difference in critical frequencies as a memory access time for the integrated circuit.

4. A semiconductor integrated circuit characteristic measuring method for measuring the characteristics of a semiconductor integrated circuit comprising a microprocessor operating in accordance with a clock, a memory having an address input port for receiving an address from the microprocessor and a data output port for outputting data corresponding to the address, and a latch circuit provided between the memory and the microprocessor and operating with a prescribed set up time according to a latch control signal from the microprocessor in order to provide data corresponding to the address from the memory to the microprocessor, said method comprising the steps of:

increasing a prescribed delay time occurring during normal operation applied to an address supplied from the microprocessor to the memory;

obtaining a critical delay time where data corresponding to the address can no longer be read in by the microprocessor in an appropriate manner;

increasing delay time applied to the address going to the latch circuit with the address being supplied to the latch circuit in a short-circuited manner rather than being supplied to the memory;

obtaining a short-circuit critical delay time where the address can no longer be read in correctly; and obtaining a time difference corresponding to a difference in critical delay times as a memory access time for the semiconductor integrated circuit.

5. A semiconductor integrated circuit device comprising:

a microprocessor operating in accordance with a clock;

a memory having an address input port for receiving an address from the microprocessor and a data output port for outputting data corresponding to the address;

a latch circuit provided between the memory and the microprocessor and operating with a prescribed set up time according to a latch control signal from the microprocessor in order to provide data corresponding to the address from the memory to the microprocessor; and a delay circuit provided between the microprocessor and the memory, capable of varying a delay time applied to the address supplied to the memory from the microprocessor from a prescribed delay time to a critical delay time where data corresponding to the address can no longer be read in by the microprocessor in an appropriate manner.

6. The semiconductor integrated circuit device of claim 5, wherein the delay circuit is equipped with a delay control input port for receiving a delay control signal from the microprocessor, an address input port for receiving an address from the microprocessor, and an address output port for, when the address is received by the address input port, outputting the address for sending to the memory with a prescribed time delay in accordance with the delay control signal received by the delay control input port, wherein, in a measuring mode, the delay control signal is gradually increased in stages every time the address from the microprocessor is updated, from a state where a delay due to the delay circuit is substantially zero to a state where the delay when the address goes from the microprocessor to the memory including delay due to the delay circuit reaches the critical delay time.

7. A semiconductor integrated circuit device comprising:

a microprocessor operating in accordance with a clock;

a memory having an address input port for receiving an address from the microprocessor and a data output port for outputting data corresponding to the address;

a latch circuit provided between the memory and the microprocessor and operating with a prescribed set up time according to a latch control signal from the microprocessor in order to provide data corresponding to the address from the memory to the microprocessor;

a switch circuit for supplying the address to the latch circuit during a measuring mode rather than to the memory; and a clock source capable of supplying a desired clock to the microprocessor in a frequency range from a frequency where the microprocessor can read in data from the latch circuit correctly to a critical frequency where the microprocessor can no longer read in the data correctly.

8. The semiconductor integrated circuit device of claim 7, wherein the clock frequency is gradually increased every time the address from the microprocessor is updated in measuring mode.

9. A semiconductor integrated circuit device comprising:

a microprocessor operating in accordance with a clock;

a memory having an address input port for receiving an address from the microprocessor and a data output port for outputting data corresponding to the address;

a latch circuit provided between the memory and the microprocessor and operating with a prescribed set up time according to a latch control signal from the microprocessor in order to provide data corresponding to the address from the memory to the microprocessor;

a delay circuit provided between the microprocessor and the memory, capable of varying a delay time applied to the address supplied to the memory from the microprocessor from a prescribed delay time to a critical delay time where data corresponding to the address can no longer be read in by the microprocessor in an appropriate manner; and a switch circuit for supplying the address to the latch circuit during a measuring mode rather than to the memory.

10. The semiconductor integrated circuit device of claim 9, wherein the delay circuit is equipped with a delay control input port for receiving a delay control signal from the microprocessor, an address input port for receiving an address from the microprocessor, and an address output port for, when the address is received by the address input port, outputting the address for sending to the memory with a prescribed time delay in accordance with the delay control signal received by the delay control input port, wherein, in a measuring mode, the delay control signal is gradually increased in stages every time the address from the microprocessor is updated, from a state where a delay due to the delay circuit is substantially zero to a state where the delay including delay due to the delay circuit reaches the critical delay time.

* * * * *